United States Patent [19]
Marek

[11] Patent Number: 5,502,375
[45] Date of Patent: Mar. 26, 1996

[54] METHOD AND APPARATUS FOR DETERMINING ORIENTATION OF POLARIZED CAPACITORS

[75] Inventor: James E. Marek, Cypress, Tex.

[73] Assignee: Compaq Computer Corporation, Houston, Tex.

[21] Appl. No.: 285,905

[22] Filed: Aug. 4, 1994

[51] Int. Cl.⁶ ................................................. G01R 29/12
[52] U.S. Cl. ........................ 324/133; 324/457; 324/524; 324/548
[58] Field of Search ................................. 324/452, 457, 324/500, 519, 524, 548, 658, 750, 133

[56] References Cited

U.S. PATENT DOCUMENTS

| | | | |
|---|---|---|---|
| 4,745,359 | 5/1988 | Leitz | 324/133 |
| 4,748,401 | 5/1988 | Aldinger | 324/658 |
| 4,779,040 | 10/1988 | Aldinger | 324/678 |
| 5,159,526 | 10/1992 | Marek | 361/301 |

Primary Examiner—Kenneth A. Wieder
Assistant Examiner—Glenn W. Brown
Attorney, Agent, or Firm—L. Jon Lindsay

[57] ABSTRACT

The orientation of a polarized capacitor is determined by applying a voltage signal to one of the leads of the capacitor and a reference signal to the other lead. The magnitude of the electric field thus generated by the capacitor is measured. Then the voltage signal and the reference signal are reversed. The magnitude of the new electric field thus generated by the capacitor is measured. The ratio of the magnitudes of the first measured electric field to the second measured electric field is computed. If the ratio is greater than one, then the capacitor is determined to be properly oriented. If the ratio is less than one, then the capacitor is determined to be improperly oriented.

20 Claims, 2 Drawing Sheets

METHOD AND APPARATUS FOR DETERMINING ORIENTATION OF POLARIZED CAPACITORS

FIELD OF THE INVENTION

This invention is related in general to electronic circuits, and more particularly to a method and apparatus for in-circuit determination of the orientation of a polarized capacitor.

BACKGROUND OF THE INVENTION

A polarized capacitor has positive and negative terminals. In the design and fabrication of an electronic circuit, it is important to correctly orient each polarized capacitor. The result of misorienting a polarized capacitor can be damaging to the circuit and dangerous to individuals. First, the circuit failure due to the misoriented capacitor can be latent and unpredictable. Second, the resultant failure of the capacitor may be sudden and violent, causing physical damage to surrounding equipment and injury to personnel.

Heretofore, reliable determination of the orientation of a polarized capacitor by automatic means after connection of the capacitor into a circuit has been problematic. In general, no measurable parameter of the capacitor reliably indicates its orientation. While some polarized capacitors exhibit greater leakage current prior to failure when reverse-biased than when forward-biased, this phenomenon is not true of all polarized capacitors and is therefore not a reliable indicator of orientation. Also, for most circuits, only a limited amount of bias potential may be applied to a capacitor without having the measurement degraded by the effect of surrounding components in the circuit. Therefore, methods based on the leakage current are not universally applicable or reliable when performed in-circuit.

Another more reliable apparatus for determining the orientation of a polarized capacitor is disclosed in U.S. Pat. No. 5,159,526, assigned to the assignee of the present invention. The apparatus in U.S. Pat. No. 5,159,526 includes circuitry for applying first and second signals to the inner and outer conducting plates of a capacitor. These two signals are out of phase. The net field external to the capacitor as a result of these signals is of the same phase as the signal applied to the outer plate of the capacitor. This electric field is sensed and a third signal is generated in response thereto. The orientation of the capacitor with respect to the connected circuit is determined by inspecting the phase of the third signal. This apparatus has the simplicity of making only one measurement to determine the orientation of the capacitor, but has the disadvantage of not providing a very sensitive and accurate measurement. Instead, it gives a mere yes/no answer for the orientation of the capacitor depending on the phase of the third signal. Thus, it is not a very flexible method of determining the orientation.

Prior to the technique in U.S. Pat. No. 5,159,526, correct orientation of a capacitor could only be ensured by visual inspection, which is costly and error-prone.

Therefore, a need has arisen for a reliable method and apparatus for in-circuit determination of the orientation of a capacitor that provides a more sensitive, accurate and flexible measurement for making this determination.

SUMMARY OF THE INVENTION

In accordance with the present invention, a method and apparatus is provided for determining the orientation of a capacitor while in a circuit.

The present invention includes circuitry for applying a voltage signal to one of the conducting plates of the capacitor and a reference signal to the other conducting plate. The resulting electric field is sensed and a first magnitude or field strength measurement is taken. Then the voltage signal and the reference signal are reversed on the conducting plates. The new electric field is sensed and a second magnitude or field strength measurement is taken. The ratio of the first measured electric field magnitude to the second measured electric field magnitude indicates the orientation of the capacitor.

The present invention provides significant advantages over the prior art by providing a sensitive, accurate and flexible method and apparatus for determining the orientation of the capacitor while in-circuit.

BRIEF DESCRIPTION OF THE DRAWINGS

A better understanding of the present invention may be obtained when the detailed description of the preferred embodiments is considered in conjunction with the following drawings, in which.

DETAILED DESCRIPTION OF THE INVENTION

Figure 2:
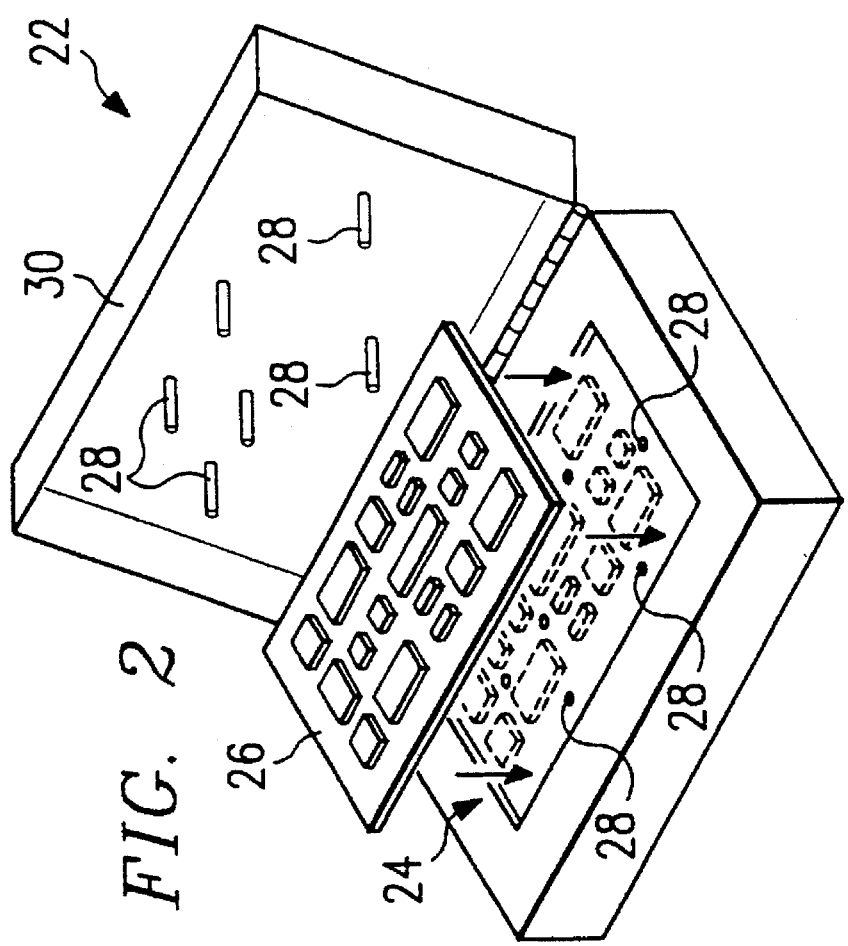
FIG. 2 illustrates a perspective view of a preferred embodiment of a board tester according to the present invention.
Figure 1:
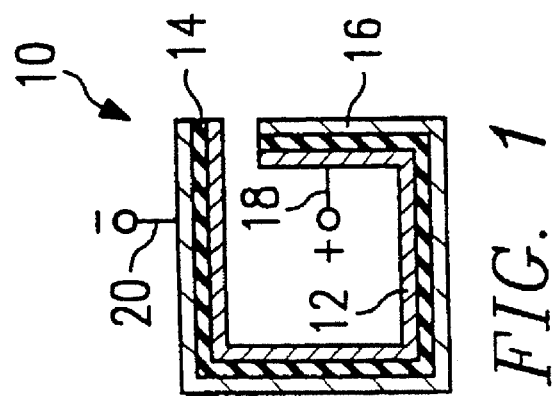
FIG. 1 illustrates a cross-sectional top view of the plates of a capacitor.
Figure 3:
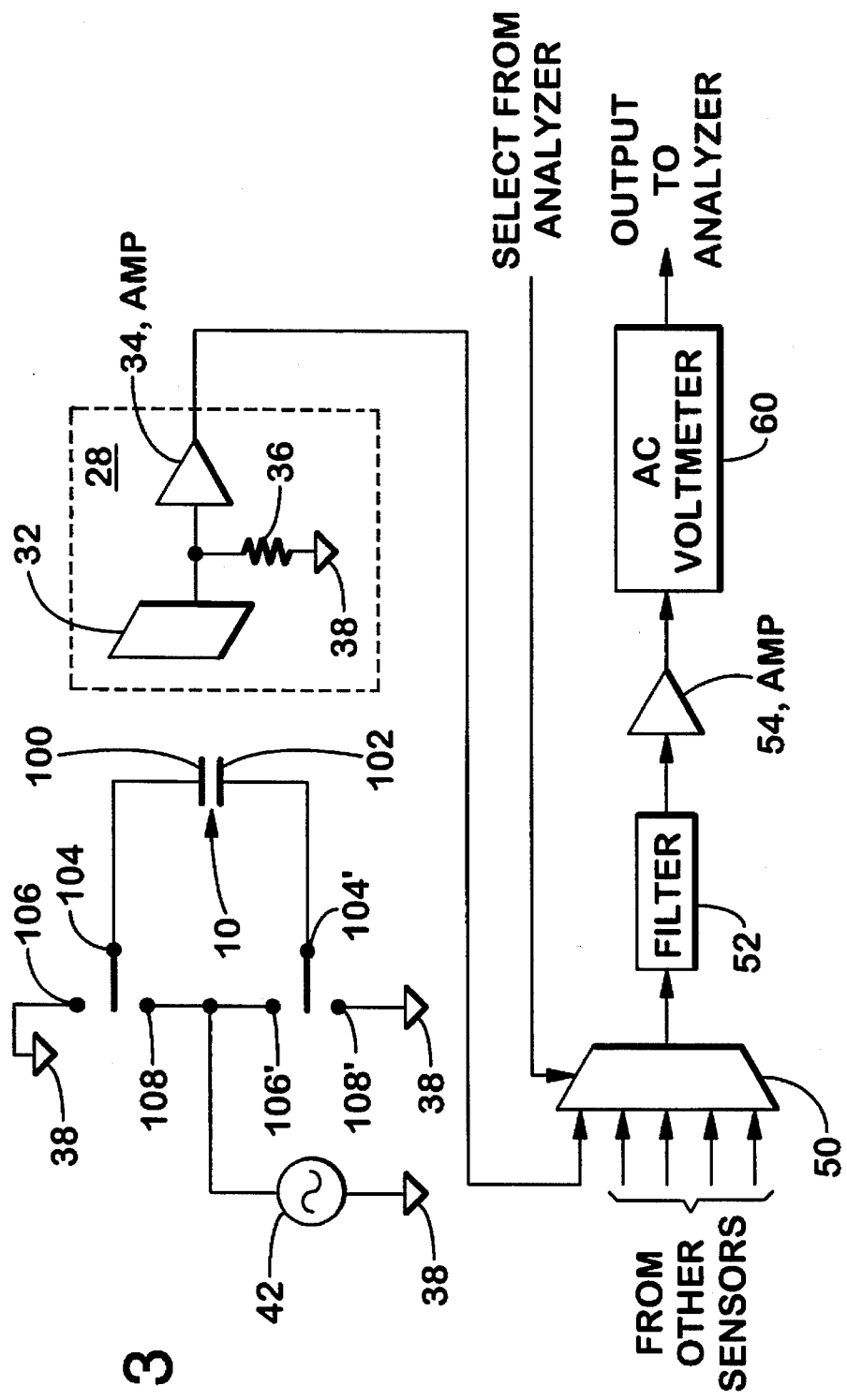
FIG. 3 illustrates a schematic representation of circuitry for determining the orientation of a capacitor.

The preferred embodiment of the present invention and its advantages are best understood by referring to FIGS. 1–3 of the drawings, like numerals being used for like and corresponding parts of the various drawings.

Referring now to FIG. 1, a cross-sectional top view of the plates of a capacitor 10 is shown. The capacitor 10 comprises inner plate 12, dielectric 14, and outer plate 16. By convention, positive polarity lead 18 (or "terminal") is connected to inner plate 12 and negative polarity lead 20 is connected to outer plate 16.

In fabricating an electrolytic capacitor, an oxide coating (or other dielectric coating) is formed on a metal foil, typically an aluminum or tantalum foil. The oxide coating has a very small thickness, but a high dielectric constant, thereby creating a high capacitance in a small package. However, when the capacitor is reverse-biased (i.e., a substantial voltage is placed across the capacitor, opposite to its designed polarity) The dielectric may break down, resulting in the undesired consequences described herein.

The measurement principle used in the present invention does not rely on any electrical parameter of the capacitor to determine the capacitor's orientation, but instead uses an inherent feature of the capacitor's construction. Specifically, as shown in FIG. 2, the electrodes of polarized electrolytic capacitors form a generally concentric arrangement. This characteristic is true for both foil or slug capacitor types.

If different potentials are applied to the leads of the capacitor through its is circuit connections, a resultant electric field is produced near the capacitor. The main component of this field results from the potential on the outer electrode, since it acts as an electrostatic shield for the inner electrode. Reversing the potentials, as would be done when a capacitor is reversed in the circuit, would cause the nearby electric field to change accordingly. A sensor placed near the capacitor to measure the electric field could thus indicate the orientation of the capacitor in the circuit.

In practice, to allow for simplified sensor design, it is more appropriate to use an alternating electric field produced by an alternating drive potential. If the outer electrode is thus driven while the inner electrode is held at a fixed reference potential, the resulting electric field strength indicates the orientation of the capacitor in a fashion similar to the use of a static field. In this case, a reversed capacitor would result in a reduced field strength due to the shielding effect of the outer electrode.

When setting fixed thresholds for these field strength measurements, any variations in the system gain will degrade the test accuracy. To eliminate this gain dependence, relative field strengths can be measured with both normal and reversed connections of the driving potentials. The ratio of these two field strength measurements, representing the relative contributions to the electric field resulting from the potentials on the inner and outer electrodes, is not affected by the system gain.

Referring now to FIG. 2, a perspective view of a tester 22 used to verify the operation of a circuit board is shown, including the correct orientation of the polarized capacitors in the circuit. The tester 22 comprises, in large part, the "bed of nails" testing circuitry typically used to input signals to various nodes on the circuit board and to monitor other signals to ensure correct operation of the circuit board. The tester 22 comprises an inlay region 24 in which the circuit board 26 rests in order to accurately align the bed of nails with the test points on the board. In addition to the conventional bed of nails, sensors 28 are provided above and below (if necessary) the circuit board 26, such that when the tester is enabled for testing (i.e., lid 30 is in a closed position) the ends of the sensors 28 will be in close proximity to the capacitors on the circuit board 26. In the preferred embodiment, a test controller (not shown) communicates with the tester 22 to provide instructions to the tester 22 and to analyze the results. The test controller is typically a programmable device.

Referring now to FIG. 3, a schematic view of the circuitry used to test the orientation of the capacitors on the circuit board 26 is shown. This test is performed with the power to the circuit board disabled. The sensors 28 each comprise a sensing material 32 (or "plate"), coupled to an amplifier 34 and a resistor 36. The resistor 36 is coupled between the sensing plate 32 and ground. It should be noted that all of the testing circuitry is referenced to a common ground. The sensing material 32 typically comprises a metal plate, such as a copper plate. Preferably, the structure of the sensing plate allows trimming the plate to a desired size. The amplifier 34 may be a field-effect transistor, which may be mounted on the sensing plate 32, having its gate driven by the signal on the sensing plate 32. The resistor 36 is typically a 10 megohm resistor. The purpose of the resistor 36 is to provide biasing for the amplifier 34.

Signal generator 42 is an AC source, typically a sine wave generator. The output of signal generator 42 is coupled to either conducting plate 100 or 102 of capacitor 10 depending on the position of switches 104 and 104'. When switches 104 and 104' are in the up position connected to terminals 106 and 106', then conducting plate 100 is electrically connected to reference signal 38, or ground, and conducting plate 102 is electrically connected to signal generator 42. Conversely, when switches 104 and 104' are in the down position connected to terminals 108 and 108', then conducting plate 100 is electrically connected to signal generator 42, and conducting plate 102 is electrically connected to reference signal 38.

It should be noted that multiple sets of switches (not shown) in addition to switches 104 and 104' could be used in conjuction with a multiplexer in order to make measurements on multiple capacitors using the same test circuitry.

In the preferred embodiment, signal generator 42 outputs a sine wave having a typical frequency of 100 Hz. Two considerations are important in choosing a frequency for the signal generator: (1) frequencies close to the frequency of the power signals input to the tester 22 (e.g., a power line frequency of 60 Hz) should be avoided, and (2) lower frequencies will facilitate testing of larger capacitance. The magnitude of the sine wave signal at the capacitor terminals is typically set to approximately 0.2 volts, so that the effect of surrounding circuitry is minimized, and so that the capacitor under test is not severely reverse-biased during the test.

Reference signal 38 and the output of signal generator 42 will normally be coupled to respective plates of several other capacitors on the same circuit board, such that the input test signal from signal generator 42 and reference signal 38 may be input to a selected one of the several capacitors without duplicating signal generator 42.

In operation, switches 104 and 104' are set to one of the terminals 106, 106', 108 and 108'. Then signal generator 42, through switches 104 and 104', provides one of the leads of the capacitor 10 (via the bed of nails) with an AC signal. The capacitor 10 will generate an electric field responsive to the signal. The sensing plate 32 is capacitively coupled to the plates of capacitor 10 (albeit weakly) and will thus be influenced by their electric field. When switches 104 and 104' are switched to the other terminal, then the capacitor 10 will generate an electric field having a different magnitude. When the signal generator 42 is coupled to the outer conductive plate 16 of capacitor 10, the capacitor 10 will generate an electric field surrounding the capacitor with a larger magnitude than when the signal generator 42 is coupled to the inner conductive plate 12. At the time of the test, it is not known to which conductive plate 12 or 16 the signal generator 42 is coupled.

When sensing plate 32 is exposed to an electric field around capacitor 10, it generates a small voltage signal which must be amplified by amplifier 34. Resistor 36 biases the amplifier. Sensor 28 then outputs the amplified voltage signal to multiplexer 50.

The analyzer (not shown) selects which multiplexed line to send through to the output from the multiplexer 50. This feature permits multiple sensors to test multiple capacitors on the same circuit board using only one filter 52, amplifier 54 and voltmeter 60. The output of the multiplexer 50 is input to a filter 52 which passes a desired frequency. The output of the filter 52 is input to an AC voltmeter 60. The output of the voltmeter is coupled to the analyzer, or test controller. The analyzer may be a programmed computer.

In the preferred embodiment, filter 52 is an RC circuit for filtering high frequencies in order to filter noise out of the system. The output of filter 52 is therefore the 100 Hz signal output from the sensor 28. This signal is input to amplifier 54, which has typical gain of several thousand to provide a convenient signal output level. Typically, amplifier 54 comprises one or more operational amplifiers.

The output of amplifier 54 is input to AC voltmeter 60. The AC voltmeter measures the voltage output of the amplifier 54 and sends that measurement to the analyzer.

In operation, in the preferred embodiment, the analyzer requests a measurement from the circuitry, specifying which of the terminals 106 or 108 the switches 104 and 104' are connected to. The analyzer then reads back the measured value from the AC voltmeter and saves this value. Then the analyzer requests another measurement from the circuitry, specifying that the switches be connected to the terminal not used in the first measurement. The analyzer reads back the second measured value. Then the analyzer computes the ratio of the first measured value to the second measured value. The orientation of the capacitor can be determined from this ratio.

For example, if in the first measurement, switches 104 and 104' are connected to terminals 106 and 106', then the voltage signal from the signal generator 42 will be connected to conducting plate 102 of capacitor 10, and the reference signal 38 will be connected to conducting plate 100. After the analyzer reads the first measurement, switches 104 and 104' will be switched over to connect to terminals 108 and 108', and the analyzer will read the second measurement.

Due to the shielding effect of the outer conducting plate 16 of capacitor 10, one of the two measured values will be larger than the other. If the first measured value is larger than the second measured value, then the ratio computed by the analyzer will be greater than one. With a ratio greater than one, the analyzer can then determine that the outer conducting plate 16 is conducting plate 102, since the first measurement put the voltage signal on conducting plate 102. On the other hand, if the first measured value is less than the second measured value, then the ratio will be less than one, and the analyzer can determine that the outer conducting plate 16 is conducting plate 100.

If the computed ratio is greater than one, and if the capacitor 10 is known to be the typical type of capacitor that has its negative polarity lead 20 attached to its outer conducting plate 16, then the analyzer determines that the capacitor is properly oriented. A typical ratio in this case is four. If the computed ratio is less than one, however, and if the capacitor 10 is known to the type of capacitor that has its negative polarity lead 20 attached to its outer conducting plate 16, then the analyzer determines that the capacitor is not properly oriented. A typical ratio in this case is one-fourth. If, on the other hand, the capacitor 10 is known to be of the type of less common capacitors that has its positive polarity lead 18 attached to its outer conducting plate 16, then the foregoing orientation determinations will be reversed.

The invention described herein provides a flexible method and apparatus since it is possible for a ratio to be less than one regardless of the orientation of the capacitor. Interference due to electric fields from other circuit elements on the circuit board could cause the ratio to be less than one with the capacitor in either a correct or incorrect orientation. In this event, the ratio can be compared to a range of known correct or incorrect ratios to determine the capacitor's orientation. Thus, the method and apparatus are more accurate and flexible than the prior art, which only gives a yes/no determination of the orientation based on the ratio being greater than or less than one.

The multiplexer 50 allows the output of a plurality of sensors 28 to be analyzed in succession. In order to allow the signals to stabilize, an appropriate settling time, typically 50 milliseconds, should be allowed for each capacitor. If a capacitor is incorrectly oriented in the circuit board, the analyzer may output a message such as "C23 polarity reversed." If a capacitor has positive and negative leads opposite to convention (i.e., the outer plate 16 is the positive plate), this can be accounted for by the analyzer as specific cases warrant. Testing of multiple capacitors could also be performed manually, using a mechanical switch to make connections to the capacitors. Then a voltmeter, read manually, would indicate the electric field magnitude. The use of the voltmeter provides a range of measurements and, thus, a more sensitive measurement, since the prior art indicated merely that the orientation was correct or incorrect based on a fixed threshold.

Capacitors connected in parallel may be tested individually by the present invention. However, if capacitors are located close together, whether or not connected in parallel, the sensors 28 should be placed such that they are located away from adjacent capacitors.

The present invention provides significant advantages over the prior art. The circuitry provides a more accurate, sensitive and flexible measurement test. The orientation of a polarized capacitor can be accurately determined while the capacitor is connected to other circuitry. A plurality of capacitors on a circuit board may be tested quickly in an automated process. Further, the present invention works with many different capacitor structures.

Although the present invention and its advantages have been described in detail, it should be understood that various changes, substitutions and alterations can be made herein without departing from the spirit and scope of the inventions as defined by the appended claims.

What is claimed is:

1. Circuitry for in-circuit determination of the orientation of a capacitor having first and second conducting plates, comprising:

means for applying first and second signals to the first and second conducting plates of the capacitor such that the capacitor generates a first external electric field responsive to said applied signals;

means for sensing the first electric field proximate to the capacitor and measuring the magnitude of the first electric field;

means for reversing said first and second signals applied to the first and second conducting plates of the capacitor such that the capacitor generates a second external electric field responsive to said reversed signals;

means for sensing the second electric field proximate to the capacitor and measuring the magnitude of the second electric field;

means for determining the ratio of the magnitude of the first electric field to the magnitude of the second electric field; and means for determining the orientation of the capacitor based upon said ratio.

2. The circuitry of claim 1 wherein said first signal is a voltage signal and said second signal is a reference signal.

3. The circuitry of claim 2 wherein:

the first conducting plate is an outer plate;

the second conducting plate is an inner plate;

said means for applying said first and second signals applies said voltage signal to said outer plate and applies said reference signal to said inner plate; and said means for determining the ratio determines whether the ratio is greater than one.

4. The circuitry of claim 3 wherein the means for determining the orientation of the capacitor determines whether the capacitor is in a desired orientation.

5. The circuitry of claim 2 wherein:

the first conducting plate is an outer plate;

the second conducting plate is an inner plate;

said means for applying said first and second signals applies said voltage signal to said inner plate and applies said reference signal to said outer plate; and said means for determining the ratio determines whether the ratio is less than one.

6. The circuitry of claim 5 wherein the means for determining the orientation of the capacitor determines whether the capacitor is in an undesired orientation.

7. The circuitry of claim 1 wherein:

said means for determining the orientation of the capacitor determines the orientation to be a desired orientation when said means for determining said ratio of said first electric field to said second electric field determines said ratio to be greater than one; and said means for determining the orientation of the capacitor determines the orientation to be an undesired orientation when said means for determining said ratio of said first electric field to said second electric field determines said ratio to be less than one.

8. The circuitry of claim 1 wherein said means for determining the orientation of the capacitor determines the capacitor to be in a desired orientation when said ratio is within a first predetermined range.

9. The circuitry of claim 8 wherein said means for determining the orientation of the capacitor determines the capacitor to be in an undesired orientation when said ratio is within a second predetermined range.

10. The circuitry of claim 1 wherein:

said means for determining the orientation determines the capacitor to be in a desired orientation when said ratio is less than one; and said means for determining the orientation determines the capacitor to be in an undesired orientation when said ratio is greater than one.

11. A method for in-circuit determination of the orientation of a capacitor having first and second conducting plates, comprising:

applying first and second signals to the first and second conducting plates of the capacitor such that the capacitor generates a first external electric field responsive to said applied signals;

sensing the first electric field proximate to the capacitor and measuring the magnitude of the first electric field;

reversing said first and second signals applied to the first and second conducting plates of the capacitor such that the capacitor generates a second external electric field responsive to said reversed signals;

sensing the second electric field proximate to the capacitor and measuring the magnitude of the second electric field;

determining the ratio of the magnitude of the first electric field to the magnitude of the second electric field; and determining the orientation of the capacitor based upon said ratio.

12. The method of claim 11 wherein said first signal is a voltage signal and said second signal is a reference signal.

13. The method of claim 12 wherein:

the first conducting plate is an outer plate;

the second conducting plate is an inner plate;

said step of applying said first and second signals includes the further steps of:

applying said voltage signal to said outer plate; and applying said reference signal to said inner plate; and said step of determining the ratio determines whether the ratio is greater than one.

14. The method of claim 13 wherein the step of determining the orientation of the capacitor determines whether the capacitor is in a desired orientation.

15. The method of claim 12 wherein:

the first conducting plate is an outer plate;

the second conducting plate is an inner plate;

said step of applying said first and second signals includes the further steps of:

applying said voltage signal to said inner plate; and applying said reference signal to said outer plate; and said step of determining the ratio determines whether the ratio is less than one.

16. The method of claim 15 wherein the step of determining the orientation of the capacitor determines whether the capacitor is in an undesired orientation.

17. The method of claim 11 wherein:

said step of determining the orientation of the capacitor determines the orientation to be a desired orientation when said step of determining the ratio of the first electric field to the second electric field determines the ratio to be greater than one; and said step of determining the orientation of the capacitor determines the orientation to be an undesired orientation when said step of determining the ratio of the first electric field to the second electric field determines the ratio to be less than one.

18. The method of claim 11 wherein said step of determining the orientation of the capacitor determines the capacitor to be in a desired orientation when said ratio is within a first predetermined range.

19. The method of claim 18 wherein said step of determining the orientation of the capacitor determines the capacitor to be in an undesired orientation when said ratio is within a second predetermined range.

20. The method of claim 11 wherein:

said step of determining the orientation determines the capacitor to be in a desired orientation when said ratio is less than one; and said step of determining the orientation determines the capacitor to be in an undesired orientation when said ratio is greater than one.

* * * * *